United States Patent
Asadi et al.

(10) Patent No.: US 9,355,716 B2
(45) Date of Patent: May 31, 2016

(54) MEMORY CHANNEL DETECTOR SYSTEMS AND METHODS

(71) Applicant: University of Hawaii, Honolulu, HI (US)

(72) Inventors: Meysam Asadi, Honolulu, HI (US); Xiujie Huang, Guangzhou (CN); Aleksandar Kavcic, Honolulu, HI (US)

(73) Assignee: University of Hawaii, Honolulu, HI (US)

( * ) Notice: Subject to any disclaimer, the term of this patent is extended or adjusted under 35 U.S.C. 154(b) by 0 days.

(21) Appl. No.: 14/157,730

(22) Filed: Jan. 17, 2014

(65) Prior Publication Data

US 2014/0223260 A1   Aug. 7, 2014

Related U.S. Application Data

(60) Provisional application No. 61/753,853, filed on Jan. 17, 2013, provisional application No. 61/804,154, filed on Mar. 21, 2013.

(51) Int. Cl.
*G11C 11/56* (2006.01)
*G11C 16/26* (2006.01)
(Continued)

(52) U.S. Cl.
CPC ............ *G11C 11/5642* (2013.01); *G11C 16/26* (2013.01); *G11C 16/3427* (2013.01); *H03M 13/3905* (2013.01); *H03M 13/41* (2013.01); *H04L 1/0054* (2013.01); *H04L 1/0059* (2013.01); *H04L 25/067* (2013.01); *H04L 2025/03363* (2013.01)

(58) Field of Classification Search
CPC .............. G11C 11/5642; G11C 16/26; G11C 16/3427; H03M 13/1105; H03M 13/41; H03M 13/3905; H04L 1/0054; H04L 25/067; H04L 1/0059; H04L 2025/03363
USPC .......................................................... 714/763
See application file for complete search history.

(56) References Cited

U.S. PATENT DOCUMENTS 8,775,913 B2 *   7/2014   Haratsch et al. .............. 714/794
8,788,923 B2 *   7/2014   Haratsch et al. .............. 714/810
(Continued)

FOREIGN PATENT DOCUMENTS

WO   2010002948 A1   1/2010

OTHER PUBLICATIONS

Dong-Hwan Lee, et al. "Estimation of NAND Flash Memory Threshold Voltage Distribution for Optimum Soft-Decision Error Correction," IEEE Transactions on Signal Processing, vol. 61, No. 2, Jan. 15, 2013.
Meysam Asadi, "Optimal Detector for Multilevel NAND Flash Memory Channels with Intercell Interface," IEEE Journal on Selected Areas in Communications, vol. 32, No. 5, May 2014.

*Primary Examiner* — James C Kerveros

(57) ABSTRACT

A method for determining decision metrics in a detector for a memory device. The method includes receiving a plurality of signal samples and extracting a set of statistics from the signal samples, wherein at least one of the statistics is non-linear or complex, is derived from a plurality of the signal samples, and is not a function of at least one real linear statistic that is derived from a plurality of the signal samples. The method also includes applying at least one decision metric function to the set of statistics to determine at least one decision metric value corresponding to at least one postulated symbol.

24 Claims, 9 Drawing Sheets

(51) Int. Cl.
*G11C 16/34* (2006.01)
*H03M 13/41* (2006.01)
*H04L 1/00* (2006.01)
*H04L 25/06* (2006.01)
*H04L 25/03* (2006.01)
*H03M 13/39* (2006.01)

(56) References Cited

U.S. PATENT DOCUMENTS 8,990,668 B2 * 3/2015 Krishnan et al. ............... 714/799
2009/0080259 A1 3/2009 Alrod et al.

* cited by examiner

MEMORY CHANNEL DETECTOR SYSTEMS AND METHODS

CROSS REFERENCE TO RELATED APPLICATIONS

The present application claims priority to U.S. Provisional Patent Application No. 61/753,853, filed Jan. 17, 2013; and United States Provisional Patent Application No. 61/804,154, filed Mar. 21, 2013.

STATEMENT REGARDING FEDERALLY SPONSORED RESEARCH OR DEVELOPMENT

This invention was made with government support under Grant Nos. ECCS-1128705, CCF-1018984, and EECS-1029081 awarded by the National Science Foundation. The government has certain rights in the invention.

BACKGROUND

As a class of semiconductor data storage systems, flash memories are used in a variety of electronic devices, for example in music players and solid-state disk drives. Multi-level cell (MLC) flash memories have relatively low costs and high densities due to continuous improvements in scaling technology and the fact that MLC memories store more than one bit per cell. Scaling technology continues to increase cell density, which in turn enhances intercell interference (ICI), especially in MLC memories. Moreover, MLC technology narrows the width of the threshold voltage for each level and reduces the margins between adjacent levels in a cell, which results in degradation of reliability. Thus, reliable detection and encoding/decoding in flash memories is oftentimes difficult.

SUMMARY OF THE INVENTION

In a first aspect, embodiments of the invention provide a method for determining decision metrics in a detector for a memory device. The method includes receiving a plurality of signal samples and extracting a set of statistics from the signal samples, wherein at least one of the statistics is non-linear or complex, is derived from a plurality of the signal samples, and is not a function of at least one real linear statistic that is derived from a plurality of the signal samples. The method also includes applying at least one decision metric function to the set of statistics to determine at least one decision metric value corresponding to at least one postulated symbol.

In another aspect, embodiments of the invention are directed to a system. The system includes a memory channel and a detector in communication with the memory channel. The detector is configured to receive a plurality of signal samples; extract a set of statistics from the signal samples, wherein at least one of the statistics is non-linear or complex, is derived from a plurality of the signal samples, and is not a function of at least one real linear statistic that is derived from a plurality of the signal samples; and apply at least one decision metric function to the set of statistics to determine at least one decision metric value corresponding to at least one postulated symbol.

In another aspect, embodiments of the invention provide a detector for a memory device. The detector includes a first circuit configured to receive a plurality of signal samples. The detector also includes a second circuit in communication with the first circuit, the second circuit configured to extract a set of statistics from the signal samples, wherein at least one of the statistics is non-linear or complex, is derived from a plurality of the signal samples, and is not a function of at least one real linear statistic that is derived from a plurality of the signal samples. The detector further includes a third circuit in communication with the second circuit, the third circuit configured to apply at least one decision metric function to the set of statistics to determine at least one decision metric value corresponding to at least one postulated symbol.

In another aspect, embodiments of the invention provide an apparatus. The apparatus includes means for receiving a plurality of signal samples and means for extracting a set of statistics from the signal samples, wherein at least one of the statistics is non-linear or complex, is derived from a plurality of the signal samples, and is not a function of at least one real linear statistic that is derived from a plurality of the signal samples. The apparatus also includes means for applying at least one decision metric function to the set of statistics to determine at least one decision metric value corresponding to at least one postulated symbol.

In a further aspect, embodiments of the invention provide a non-transitory computer readable medium including software for receiving a plurality of signal samples; extracting a set of statistics from the signal samples, wherein at least one of the statistics is non-linear or complex, is derived from a plurality of the signal samples, and is not a function of at least one real linear statistic that is derived from a plurality of the signal samples; and applying at least one decision metric function to the set of statistics to determine at least one decision metric value corresponding to at least one postulated symbol.

In another aspect, embodiments of the invention provide a method for determining decision metrics in a detector for a memory device. The method includes receiving a plurality of signal samples and computing a set of statistics, wherein at least one of the statistics is obtained by FIR filtering or IIR filtering of at least one squared signal sample. The method also includes applying at least one decision metric function to the set of statistics to determine at least one decision metric value corresponding to at least one postulated symbol.

In a further aspect, embodiments of the invention provide a method for determining decision metrics in a detector for a memory device. The method includes receiving a plurality of signal samples and computing a set of statistics using a transformation of signal samples to obtain a characteristic-function-like set of statistics. The method also includes applying at least one decision metric function to the set of statistics to determine at least one decision metric value corresponding to at least one postulated symbol.

In another aspect, embodiments of the invention provide a method for determining decision metrics in a detector for a memory device. The method includes receiving a signal sample and at least one adjacent signal sample and computing a set of at least one statistic, wherein the at least one statistic is obtained by nonlinearly processing the at least one adjacent signal sample. The method also includes applying at least one decision metric function to the at least one statistic to determine at least one decision metric value corresponding to at least one postulated symbol.

DETAILED DESCRIPTION OF THE INVENTION

While the description herein generally refers to semiconductor memories, and various types of semiconductor memories such as MLC flash memories, it may be understood that the devices, systems and methods apply to other types of memory devices. The described embodiments of the invention should not be considered as limiting.

Embodiments of the invention may be used with or incorporated in a computer system that may be a standalone unit or include one or more remote terminals or devices in communication with a central computer via a network such as, for example, the Internet or an intranet. As such, the computer or "processor" and related components described herein may be a portion of a local computer system or a remote computer or an on-line system or combinations thereof. As used herein, the term "processor" may include, for example, a computer processor, a microprocessor, a microcontroller, a digital signal processor (DSP), circuitry residing on a memory device, or any other type of device that may perform the methods of embodiments of the invention.

Embodiments of the invention are directed generally to systems, methods and devices that may be used to detect written symbols by observing channel output values in a memory device, such as a semiconductor memory device, in the presence of intercell interference (ICI). Various embodiments allow for improvements in detector hard decision bit-error rates and detector soft decision quality.

Embodiments of the invention are described herein using channel models, including one-dimensional (1D) models with causal output memory and two-dimensional (2D) anti-causal models. Various embodiments are described herein as a mathematically tractable Viterbi-like maximum a posterior (MAP) sequence detector for the 1D causal model with output memory. The statistics (sometimes referred to herein as "sufficient statistics") of the channel model that may be used to implement the MAP detector may be obtained, for example, by using a fast Fourier transform (FFT). In various embodiments, a Gaussian approximation (GA) sequence detector is presented. In various embodiments, the MAP detector and the GA detector may be used for 2D anti-causal memory channels.

Figure 1:
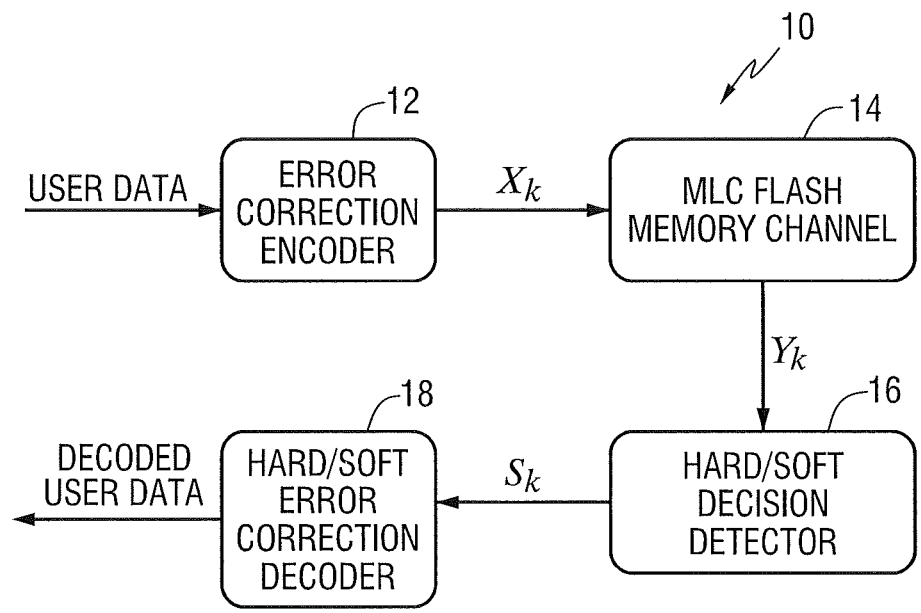
FIG. 1 illustrates a block diagram of an embodiment of a memory system.

FIG. 1 illustrates a block diagram of an embodiment of a memory system 10. The memory system 10 is illustrated as an MLC flash memory system. It may be understood that the system 10 may be any type of memory system. The memory system 10 includes an encoder 12, a channel 14, a detector 16, and a decoder 18.

Figure 2:
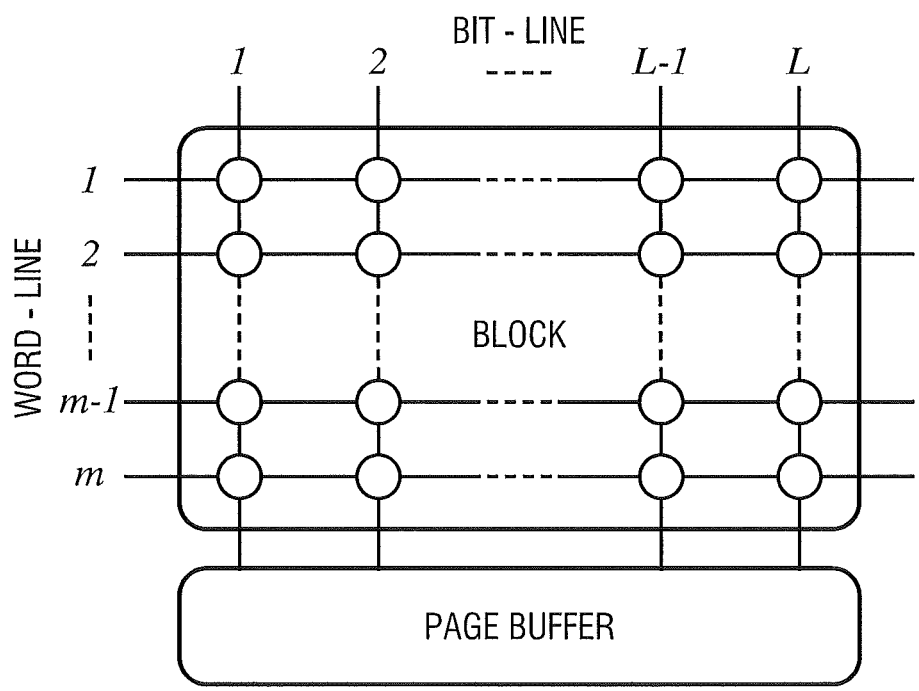
FIG. 2 illustrates an embodiment of a flash memory structure.

By way of example, a NAND flash memory is discussed hereinbelow. A NAND flash memory consists of cells, where each cell is a transistor with an extra polysilicon strip (i.e., the floating gate) between the control gate and the device channel. By applying a voltage to the floating gate, a charge is maintained/stored in a cell. In order to store data in the cell of an MLC flash memory, a certain voltage (i.e., one that falls into one of multiple required voltage ranges) is applied to the cell. All memory cells are hierarchically organized in arrays, blocks and page partitions, as illustrated in FIG. 2. The smallest unit that can be simultaneously accessed for programming (writing) or reading is a page, and the smallest unit that can be erased is a block.

Incremental step pulse program (ISPP), also called the program-and-verify technique with a staircase, or iterative programming, is an iterative technique that can verify the amount of voltage carried at each cell after each programming cycle. The ISPP approach provides a series of verification pulses right after each program pulse. Consequently, the threshold voltage deviation of a programmed cell tends to behave like a uniform random variable. As the programming of a cell is a one-way operation and because it is not possible to erase a specific cell separately from other cells in a block, a memory cell should be erased before programming. The distribution of the threshold voltage of an erased memory cell tends to be Gaussian.

An "even/odd bit-line structure" architecture may be used to program (write) data. Such an architecture separates all the cells into those at even bit-lines and those at odd bit-lines. During the process of programming, the cells at even bit-lines along a word-line are written at the same time instant, and then the cells at odd bit-lines along the word-line are written at the next time instant. An "all-bit-line structure" architecture may likewise be used to program the data. In such an architecture, all cells along a word-line are written simultaneously without distinguishing between even and odd cells. The even/odd bit-line structure has the advantage that circuitry may be shared and reused, while the all-bit-line structure has the advantage that the ICI tends to be lower.

Figure 3:
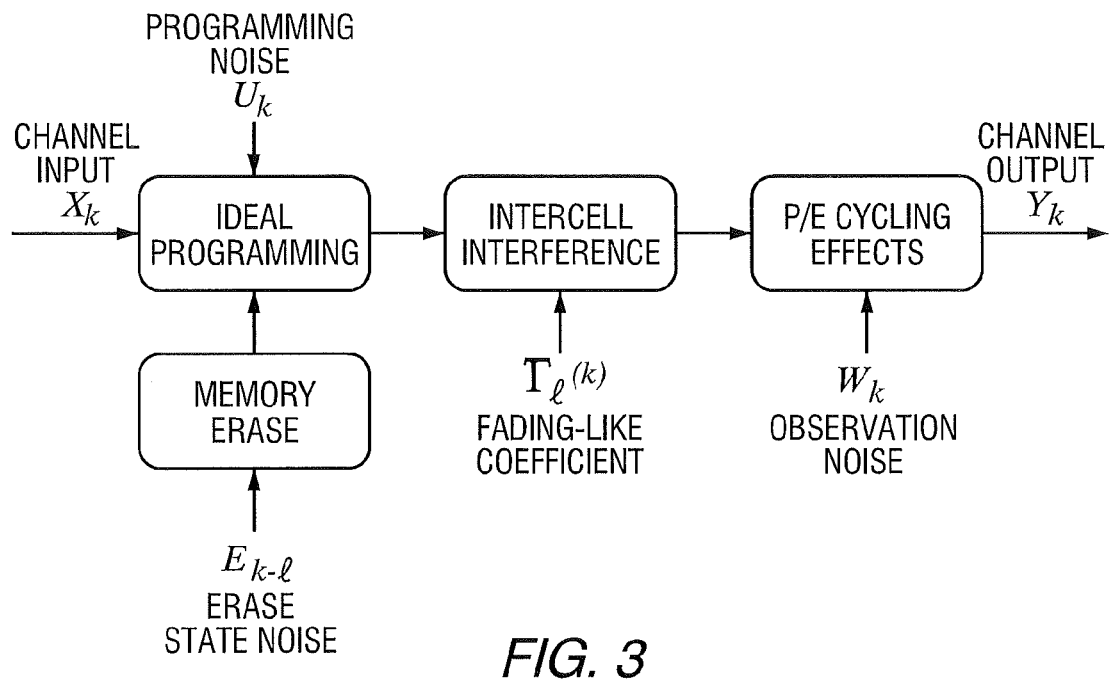
FIG. 3 illustrates an embodiment of a flash memory channel model.

As illustrated in FIG. 3, two sources of performance degradation that affect the threshold voltage in each memory cell are program/erase (PE) cycling and ICI. The PE cycling process distorts the final threshold voltage of a transistor in two different ways. The first distortion is due to the trapping and detrapping ability of the interface at the transistor gate, which leads to a fluctuation of the final threshold voltage of the cell. The fluctuation may be modeled by a Gaussian distribution with parameters dependent on the input voltages at a neighborhood of floating gates (i.e., signal-dependent noise) and the number of times that a cell has been programmed and erased. The second distortion arises when electrons are trapped in the interface area of a cell, which causes degradation of the threshold voltage. This effect may be exacerbated as the device undergoes many PE cycles.

ICI is a degradation that grows with density. As cells are packed closer to each other, the influence of threshold voltages from neighboring cells increases. In other words, due to the parasitic capacitance coupling effects among the neighboring cells, the change in the threshold voltage on one cell during the programming (charging) affects the final voltages of all the other cells (especially those cells that were already programmed). This disturbance may be modeled by a (truncated) Gaussian distribution whose parameters depend on the distance between cells.

Although a flash memory channel is not one-dimensional, but rather two-dimensional (2D) because the channel is a page-oriented channel, for clarity the channel model may be presented as a one-dimensional (1D) causal channel model. Also, a flash memory channel is not causal, but rather anti-causal, because ICI is an anti-causal effect because only those cells that are programmed after the victim cell actually affect the victim cell. The 1D causal channel model is useful in formulating an optimal detector. As described hereinbelow, such a detector may be extrapolated to cover 2D anti-causal channel.

Let $k \in \mathbb{Z}$ stand for discrete time (in this case, position in the cell array). The channel input, denoted by $X_k$, is the intended stored voltage amount in the k-th cell. The channel output denoted by $Y_k$ is the channel output voltage corresponding to the input value $X_k$. According to MLC technology, it may be assumed that the channel input random variable $X_k$ takes value from a finite alphabet $X=\{v_0, v_1, \ldots, v_{m-1}\}$ with $|X|=m<\infty$. It may be assumed that the channel input and the channel output have the relation:

$$Y_k = X_k + \sum_{l=1}^{L} \Gamma_l^{(k)}(Y_{k-l} - E_{k-l}) + W_k + U_k \quad (1)$$

where: $E_k$ is the erase-state noise at the k-th cell, modeled as a Gaussian random variable with mean $\mu_e$ and variance $\sigma_e^2$, that is, $E_k \mathcal{N}(\mu_e, \sigma_e^2)$; $\Gamma_l^{(k)}$ is a fading-like coefficient that models causal ICI from the (k-1)-th cell towards the k-th cell (victim cell). We assume $\Gamma_l^{(k)}$ also to be a Gaussian random variable, $\Gamma_l^{(k)} \sim \mathcal{N}(\gamma_l, g_l)$; L is the output memory, which implies that the current channel output $Y_k$ is affected by its L neighbors $Y_{k-1}, Y_{k-2}; \ldots Y_{k-L}$; $U_k$ denotes the programming noise resulting from using the ISPP method of programming the k-th cell of a certain word-line—this noise is modeled as a zero mean uniform random variable with width $\Delta$, that is, $U_k \sim U(-\Delta/2, \Delta/2)$; and $W_k$ is observation noise due to the PE cycling, and is distributed as a zero mean Gaussian random variable with variance $\sigma_w^2$, that is, $W_k \sim \mathcal{N}(0, \sigma_w^2)$.

In one embodiment it may be assumed that all random variables $\Gamma_l^{(k)}$, $E_{k-l}$, $W_k$ and $U_k$ are mutually independent for all k and all l and it may be assumed that the PE cycling/aging effect is incorporated into the model through the knowledge of $\sigma_w^2$. That is, $\sigma_w^2$ may depend on the device age. It may be understood that all noise sources and their parameters may be signal-dependent.

Detectors constructed according to various embodiments may cover an extended channel model that covers intersymbol interference (ISI) in addition to intercell interference (ICI). Here, ISI denotes the dependence of the channel output on a neighborhood of intended written symbols (channel inputs) and ICI denotes the dependence of the channel output on a neighborhood of stored voltage values (channel outputs). Let $X_k$ be the channel input at discrete time index k, which takes value from a finite alphabet X with $|X|<\infty$. Let $Y_k$ be the channel output corresponding to the input $X_k$. The following causal channel model may be considered:

$$Y_k = \sum_{m=0}^{M} A_m^{(k)} X_{k-m} + \sum_{l=1}^{L} B_l^{(k)}(Y_{k-l} + E_{k-l}) + W_k \quad (1a)$$

where: $A_m^{(k)}$ is Gaussian random variable $\mathcal{N}(\alpha_m, s_m)$; $B_l^{(k)}$ is Gaussian random variable $\mathcal{N}(\beta_l, g_l)$; $E_{k-l}$ is Gaussian random variable $\mathcal{N}(0, \sigma_E^2)$; and $W_k$ is Gaussian random variable $\mathcal{N}(0, \sigma_W^2)$.

Each one of the above random variables is independent of the same random variable at a different time index. Also, all random variables $A_m^{(k)}$, $B_l^{(k)}$, $E_{k-j}$, $W_k$ are mutually independent. In equation (1a), the term $U_k$ is missing to illustrate that not all channels may suffer from quantization (programming) noise. If the channel does suffer from quantization noise, the term $U_k$ may be included akin to equation (1).

It may be understood that the coefficients A and B in (1a) (or the parameters that describe their statistical behavior if the coefficients are random variables) and the parameters of the noise sources $E_k$, $W_k$ and $U_k$ may be signal-dependent. In that case, the detector may exhibit signal-dependence. It may be understood that embodiments contemplate detectors that exhibit signal-dependent features by choosing the decision metric functions among a set of signal-dependent functions.

The sequence of random variables $(X_1, X_2 \ldots X_n)$ of length n may be denoted by $X_1^n$. The realization sequence $(x_1, x_2 \ldots x_n)$ may be denoted by $x_1^n$. The set of all possible realizations of the random sequence $X_1^n$ may be denoted by $X^n$.

Detecting the input realization sequence $x_1^n$ (for n>0) from the output realization $y_1^n$ of the above channel model is done as follows. The maximum a posteriori (MAP) sequence detector of the state sequence $x_1^n$ is the sequence $\hat{x}_1^n$ that maximizes the joint conditional pdf:

$$\hat{x}_1^n = \arg\max_{x_1^n \in X^n} f(x_1^n, y_1^n \mid x_{1-M}^0, y_{1-L}^0). \quad (2)$$

As shorthand, $f(\underline{x}, \underline{y} | i.c.)$ may be denoted as the conditional pdf of the right hand side of (2), where i.c. stands for initial condition $(x_{1-m}^0, y_{1-L}^0)$. In various embodiments, the initial condition is assumed to be known.

It may be assumed that the input sequence is a Markov process of order M. The pdf in (2) may be factored as:

$$\begin{aligned} f(\underline{x}, \underline{y} \mid i.c.) &= f(x_1^n, y_1^n \mid x_{1-M}^0, y_{1-L}^0) \\ &= P(x_1^n \mid x_{1-M}^0, y_{1-L}^0) f(y_1^n \mid x_{1-M}^n, y_{1-L}^0) \\ &= \prod_{j=1}^{n} (P(x_j \mid x_{j-M}^{j-1}) f(y_j \mid x_{j-M}^j, y_{j-L}^{j-1})). \end{aligned} \quad (3)$$

Subsequently, the MAP detected sequence is equal to:

$$\hat{x}_1^n = \mathrm{argmin}_{x_1^n \in X^n} \sum_{j=1}^{n} \underbrace{[-\ln(P(x_j \mid x_{j-M}^{j-1})) - \ln(f(y_j \mid x_{j-M}^j, y_{j-L}^{j-1}))]}_{\text{Branch metric } \Lambda_{MAP}(x_{j-M}^j, y_{j-L}^j)\{5\}} \quad (4)$$

Evaluating the branch metric $\Lambda_{MAP}(\bullet, \bullet)$ may require evaluating the conditional pdf $f(y_j | x_{j-M}^j, y_{j-L}^{j-1})$ or some function thereof. The branch metric depends on L+1 real valued variables $y_j, \ldots, y_{j-L}$. It may be desired to extract sufficient statistics (or a subset of sufficient statistics, referred to as "statistics") from $y_{j-L}^j$ that will allow efficient computation of branch metrics.

The channel model may be rewritten as:

$$Y_k = \underbrace{\sum_{m=0}^{M} A_m^{(k)} X_{k-m} + W_k}_{R} + \sum_{l=1}^{L} \underbrace{B_l^{(k)}(Y_{k-l} + E_{k-l})}_{z_l}. \quad (5)$$

The conditional characteristic function of R and $Z_l$ may be computed under the assumptions that $X_{k-M}^k = x_{k-M}^k$ and $Y_{k-L}^{k-1} = y_{k-L}^{k-1}$ are given. Note that if $X_{k-M}^k = x_{k-M}^k$ is given, R is Gaussian $\mathcal{N}(\mu_R, \sigma_R^2)$ where:

$$\mu_R = \mathbb{E}[R \mid X_{k-M}^k = x_{k-M}^k] \quad (6)$$

$$= \sum_{m=0}^{M} \alpha_m x_{k-m}$$

$$\sigma_R^2 = \mathbb{E}[(R - \mu_R)^2 \mid X_{k-M}^k = x_{k-M}^k] \quad (7)$$

$$= \sum_{m=0}^{M} s_m x_{k-m}^2 + \sigma_W^2.$$

Hence, the conditional characteristic function of R is given as:

$$G_{R \mid X_{k-M}^k}(t) = \mathbb{E}[e^{iRt} \mid X_{k-M}^k = x_{k-M}^k] \quad (8)$$

$$= \exp\left(-\frac{1}{2}\sigma_R^2 t^2 + i\mu_R t\right).$$

Similarly, as illustrated hereinbelow for a product of two independent Gaussian variables, the conditional characteristic function of $Z_l$ can be computed when $Y_{k-l}^{k-1} = y_{k-l}^{k-1}$ and $X_{k-M}^k = x_{k-M}^k$ are given, as:

$$G_{Z_l \mid Y_{k-l}^{k-1}, X_{k-M}^k}(t) = \mathbb{E}[e^{iZ_l t} \mid Y_{k-l}^{k-1} = y_{k-l}^{k-1}, X_{k-M}^k = x_{k-M}] \quad (9)$$

$$= \frac{1}{\sqrt{1 + g_l \sigma_E^2 t^2}} \exp\left(\frac{-t^2(y_{k-l}^2 g_l + \beta_l^2 \sigma_E^2) + 2i y_{k-l} \beta_l}{2(1 + g_l \sigma_E^2 t^2)}\right)$$

Combining (8) and (9), and utilizing the conditional independence (given $y_{k-l}^{k-1}$ and $x_{k-M}^k$), yields the characteristic function:

$$G_{Y_k \mid Y_{k-l}^{k-1}, X_{k-M}^k}(t) = \mathbb{E}[e^{iY_k t} \mid Y_{k-l}^{k-1} = y_{k-l}^{k-1}, X_{k-M}^k = x_{k-M}] \quad (10)$$

$$= \frac{1}{\sqrt{\prod_{l=1}^{L}(1 + g_l \sigma_E^2 t^2)}} \exp\left(-\frac{1}{2}\sigma_R^2 t^2 + i\mu_R t + \sum_{l=1}^{L}\left[\frac{-t^2(y_{k-l}^2 g_l + \beta_l^2 \sigma_E^2) + 2i t y_{k-l} \beta_l}{2(1 + g_l \sigma_E^2 t^2)}\right]\right)$$

In a system, sampling the characteristic function at various values of t, yields a set of nonlinear complex (i.e., nonlinear) statistics dependent on a plurality of signal samples.

Because the pdf is the Fourier transform of the characteristic function, the conditional probability $f(y_j \mid x_{j-M}^j, y_{j-L}^{j-1})$ can be obtained as:

$$f(y_j \mid x_{j-M}^j, y_{j-L}^{j-1}) = \int_{-\infty}^{\infty} G_{Y_j \mid X_{j-M}^j Y_{j-L}^{j-1}}(t) e^{-i y_j t} dt. \quad (11)$$

In practice, the above integral may be implemented using a Fast Fourier Transform (FFT).

The branch metric $\Lambda_{MAP}(x_{j-M}^j, y_{j-L}^j)$ in (4) may be numerically computed for each branch in the Viterbi trellis using the fast Fourier transform (FFT). In various embodiments, for each branch in the trellis an FFT may be computed. The FFT itself is a complex (non-real) linear statistic. In symbol-by-symbol detectors, the trellis states deviate to a single state, and a branch metric deviates to a symbol-by-symbol decision metric. Hence, the term "decision metric" denotes either a branch metric in a Viterbi-like detector or a decision metric in a symbol-by-symbol detector.

It may be understood that the characteristic function and the pdf form a transform pair, where the elements of the pair are the FFT and the inverse FFT (iFFT) of each other. Embodiments disclosed herein are not limited to only characteristic functions, but apply to all other characteristic-function-like transforms (and their inverses). One example is the moment-generating function, which is the Laplace transform of the pfd. Other examples may include wavelet transforms, z-transforms, etc. It may be understood that the characteristic function embodiment contemplates all other characteristic-function-like transform embodiments.

For the special case in which $\sigma_W^2$ does not depend on $x_{j-M}^j$ and $s_m = 0$ for every m, one FFT may be computed for each trellis section (if the channel model contains ISI) or for each symbol (in a symbol-by-symbol fashion) if the channel model contains no ISI and does not require a trellis representation. Thus, the FFT is the same for all branches of the trellis section, but the actual branch metric values (decision metric values) may be obtained by sampling the FFT at different points.

Figure 4:
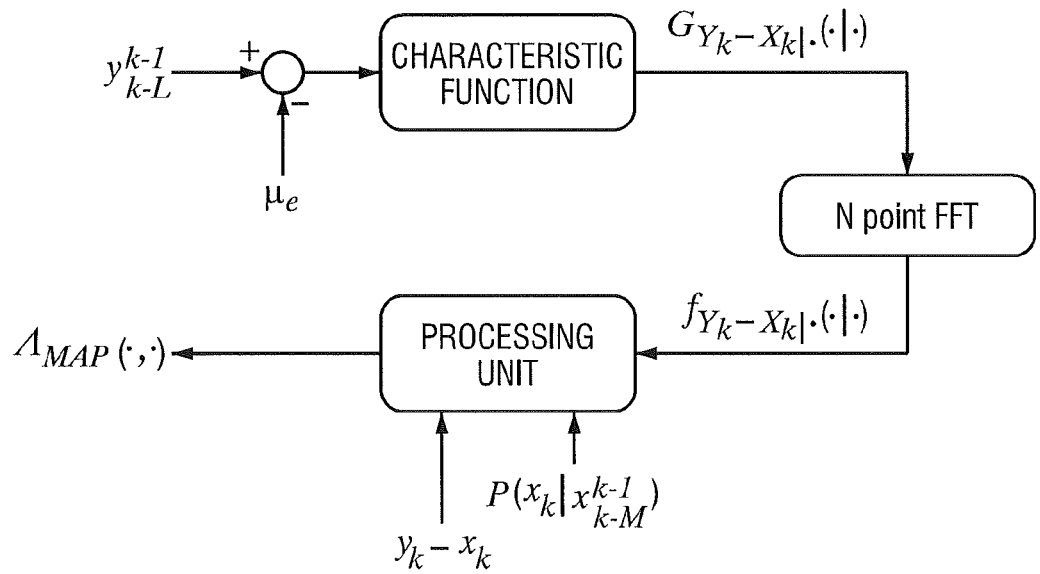
FIG. 4 illustrates an embodiment of a branch metric computation using a Fast Fourier Transform.

The channel outputs $y_{k-l}^k$ may need to be processed in order to formulate the branch metrics. The processing complexity depends on the order L. FIG. 4 illustrates a branch metric computation using the FFT.

Example: L=1: If L=1, then (17) reveals that a set of sufficient statistics for the computation of branch metrics is: linear statistic $y_k$; linear statistic $\beta_1 y_{k-1}$; and nonlinear statistic $g_1 y_{k-1}^2$.

Figure 5:
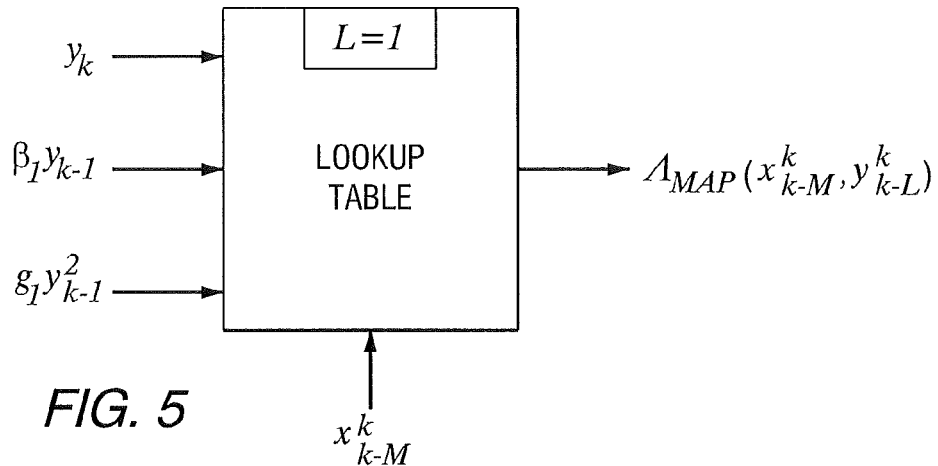
FIGS. 5-7 illustrate embodiments of lookup tables.

In various embodiments, $\Lambda_{MAP}$ may be obtained using a lookup table as illustrated in FIG. 5.

Example: L=2: If L=2, the exponent in (17) reveals that a set of sufficient statistics is: linear statistic $y_k$; linear statistic $\beta_1 y_{k-1} + \beta_2 y_{k-2}$; linear statistic $\beta_1 g_2 y_{k-1} + \beta_2 g_1 y_{k-2}$; nonlinear statistic $g_1 y_{k-1}^2 + g_2 y_{k-2}^2$; and nonlinear statistic $g_1 g_2 y_{k-1}^2 + g_1 g_2 y_{k-2}^2$.

Figure 6:
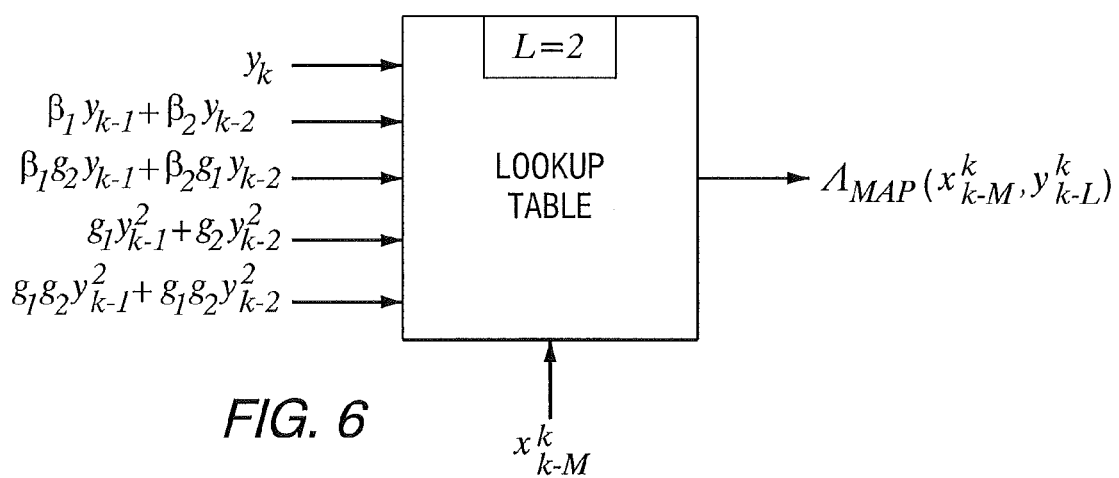

Consequently, the branch metrics $\Lambda_{MAP}$ may be computed using a lookup table as illustrated in FIG. 6.

Example: L>2: Extrapolating from the previous two examples, in various embodiments a set of sufficient statistics that solve this problem involve two types of finite impulse response (FIR) filters: one or more FIR filters acting linearly on the signal $y_k$; and one or more FIR filters acting on the nonlinearly modified signal $y_k^2$.

Figure 7:
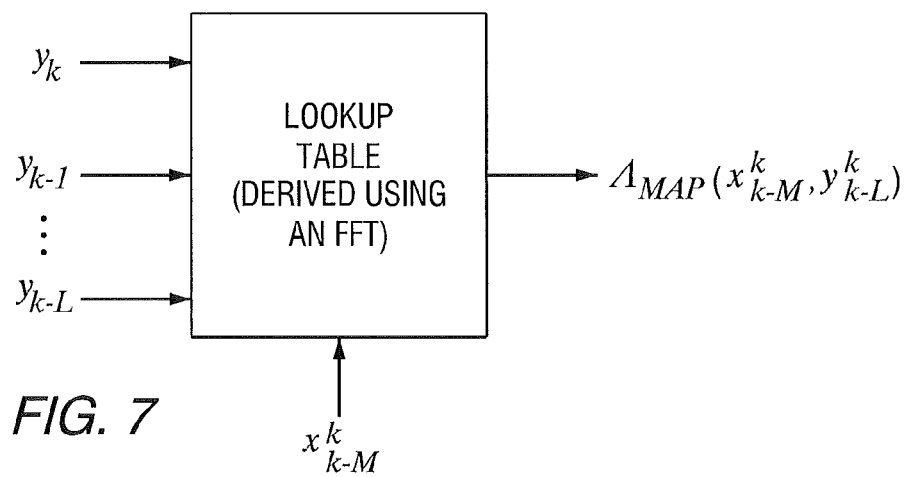

In various embodiments, a lookup table whose inputs are all the sufficient statistics may be too complicated to implement. In various embodiments, a lookup table as shown in FIG. 7 may be used.

The following outlines a suboptimal detector based on the Gaussian approximation according to various embodiments. According to (1), $Y_k$ may be obtained as the summation of several random variables. Assume that $f(y_j \mid x_{j-M}^j, y_{j-L}^{j-1})$ may be approximated by a Gaussian pdf as follows $$f(y_j \mid x_{j-M}^j, y_{j-L}^{j-1}) \sim \mathcal{N}(\mu_G, \sigma_G^2), \quad (12)$$

where, $$\mu_G = \mathbb{E}[Y_j \mid Y_{j-l}^{j-1} = y_{j-l}^{j-1}, X_{j-M}^j = x_{j-M}^j] \quad (13)$$

$$= \sum_{m=1}^{M} \alpha_m x_{j-m} + \sum_{l=1}^{L} \beta_l y_{j-l}$$

-continued $$\sigma_G^2 = \text{Var}[Y_j | Y_{j-l}^{j-1} = y_{j-l}^{j-1}, X_{j-M}^j = x_{j-M}^j] \quad (14)$$

$$= \sum_{m=1}^{M} s_m x_{j-m}^2 + \sum_{l=1}^{L} (g_l \sigma_E^2 + g_l y_{j-l}^2 + \sigma_E^2 \beta_l^2) + \sigma_W^2$$

Hence, using a similar procedure as used hereinabove, the Gaussian) approximation branch metrics $\Lambda_{MAP}^{(G)}(x_{j-M}^j, y_{j-L}^j)$ in (4) may be derived as:

$$\Lambda_{MAP}^{(G)}(x_{j-M}^j, y_{j-L}^j) = -\ln(P(x_j | x_{1-M}^{j-1})) - \ln(f(y_j | x_{j-M}^j, y_{j-L}^{j-1})) \quad (15)$$

$$= -\ln(P(x_j | x_{1-M}^{j-1})) + \frac{1}{2}\left(\ln(2\pi\sigma_G^2) + \frac{(y_j - \mu_G)^2}{\sigma_G^2}\right)$$

The subset of sufficient statistics for computing $\Lambda_{MAP}^{(G)}(\bullet, \bullet)$ are:

$$\omega_j = y_j$$

$$\theta_j = \sum_{l=1}^{L} \beta_l y_{j-l}$$

$$\phi_j = \sum_{l=1}^{L} g_l y_{j-l}^2.$$

The first two statistics are linear and the third is nonlinear.

Figure 8:
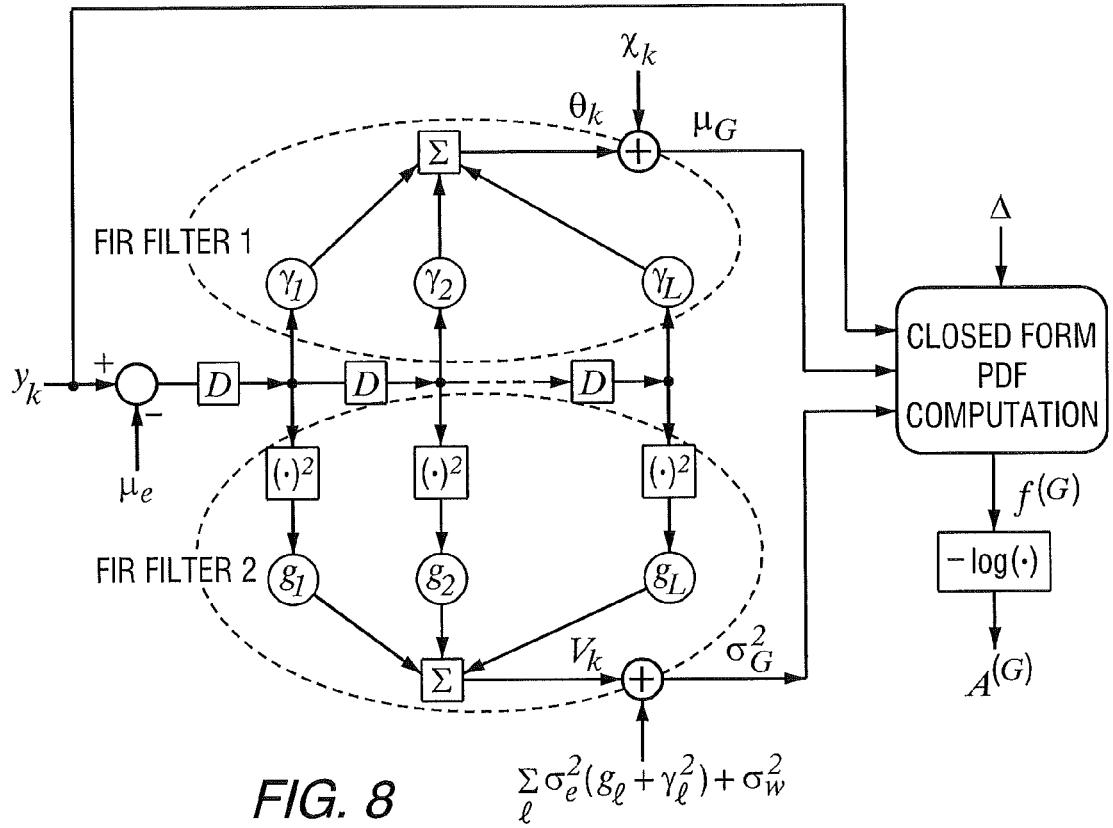
FIG. 8 illustrates an embodiment of a computation module.

Hence, the computation of $\Lambda_{MAP}^{(G)}(x_{j-M}^j, y_{j-L}^j)$ is equivalent to computing $\Lambda_{MAP}^{(G)}(x_{j-M}^j, \omega_j, \theta_j, \phi_j)$. Thus, the entire vector of L+1 signal samples $y_{j-L}^j$ (see FIG. 7) may be replaced by a new vector $[\omega_j, \theta_j, \phi_j]$ of only three statistics (even if L>2). Furthermore, in various embodiments, the actual computation of $\Lambda_{MAP}^{(G)}(x_{j-M}^j, \omega_j, \theta_j, \phi_j)$ does not require lookup tables, but may be implemented using, for example, digital signal processing (DSP) components such as multipliers and adders. FIG. 8 illustrates an embodiment of a branch metric computation module of a GA detector using FIR filters.

As apparent from FIG. 8, the signal samples may be either mean-adjusted or non-mean adjusted. In various embodiments, the term "signal sample" may encompass any of the following examples: raw signal sample, mean-adjusted signal sample, pre-equalized signal sample, digitized and/or quantized signal sample, etc.

If any of the channel coefficients' parameters $\alpha_m$, $s_m$, $\beta_l$, $g_l$, $\sigma_E^2$ and $\sigma_W^2$ depend on the actual realization of the channel input $X_{k-M}^k$, then a class of signal-dependent (pattern-dependent) detectors are indicated.

In various embodiments, a noise model ($V_k$) for the channel model (1) may be represented as:

$$Y_k = \sum_{m=0}^{M} A_m^{(k)} X_{k-m} + \sum_{l=1}^{L} B_l^{(k)}(Y_{k-l} + E_{k-l}) + V_k \quad (16)$$

The noise model not only has Thermal Gaussian noise ($W_k$), but it also contains the programming noise $U_k$. The programming noise (akin to quantization error) may be modeled by uniform distribution, which is assumed to be independent in all other source of noises. Therefore, the noise model ($V_k$) may be considered as:

$$V_k = W_k + U_k$$

where, $W_k$ is the same Gaussian random variable and $\mathcal{N}(0, \sigma_W^2)$, and $U_k$ is the Uniform random variable $U(o, \Delta_k)$.

Each of random variables is independent of the same random variable at a different time index. Also, all random variables $A_m^{(k)}$, $B_l^{(k)}$, $E_{k-j}$, $W_k$ and $U_k$ are mutually independent.

By applying a similar FFT approach as discussed hereinabove, the characteristic function for the channel model may be calculated as:

$$G_{Y_k | Y_{k-l}^{k-1}, X_{k-M}^k}(t) = \mathbb{E}[e^{iY_k t} | Y_{k-l}^{k-1} = y_{k-l}^{k-1}, X_{k-M}^k = x_{k-M}] \quad (17)$$

$$= \frac{1}{\sqrt{\prod_{l=1}^{L}(1 + g_l \sigma_E^2 t^2)}} \exp\left(-\frac{1}{2}\sigma_R^2 t^2 + i\left(\mu_R + \frac{\Delta_k}{2}\right)t + \sum_{l=1}^{L}\left[\frac{-t^2(y_{k-l}^2 g_l + \beta_l^2 \sigma_E^2) + 2it y_{k-l} \beta_l}{2(1 + g_l \sigma_E^2 t^2)}\right]\right) \text{Sinc}\left(\frac{\Delta_k t}{2}\right)$$

where, $$\text{Sinc}(\zeta) \triangleq \frac{\sin(\zeta)}{\zeta}.$$

Note that if the quantization noise (programming noise) has no temporal dependence and no signal-dependence, $\Delta = \Delta_k$ may be used.

The whole conditional distribution may be approximated as a Gaussian distribution, and thus a suboptimal detector would be obtained as discussed hereinabove. The approximation may be modified by separating the major programming noise from other sources of noise in the model. Thus, the noise model $V_k$ may be considered for the channel. The channel model may be rewritten as:

$$Y_k = \sum_{m=0}^{M} A_m^{(k)} X_{k-m} + \sum_{l=1}^{L} B_l^{(k)}(Y_{k-l} + E_{k-l}) + W_k + U_k \quad (18)$$

$$= Z_k + U_k.$$

The random variable $Z_k | Y_{k-l}^{k-1}, X_{k-M}^k$ may be approximated as a Gaussian distribution $\mathcal{N}(\mu_G, \sigma_G^2)$ where $\mu_G$ and $\sigma_G^2$ are derived in (14). The conditional distribution is obtained by, for example, convolution between the Gaussian probability distribution $Z_k | Y_{k-l}^{k-1}, X_{k-M}^k$ and the uniform distribution $U_k$.

$$f_{Y_k | Y_{k-l}^{k-1}, X_{k-M}^k}(y_k | y_{k-l}^{k-1}, x_{k-M}^k) = f_{Z_k | Y_{k-l}^{k-1}, X_{k-M}^k}(z_k | y_{k-l}^{k-1}, x_{k-M}^k) * \quad (19)$$

$$f_{U_k}(u)$$

$$= \int_{y_k - \Delta_k}^{y_k} \frac{1}{\sqrt{2\pi}\,\sigma_G \Delta_k} e^{-\frac{(z_k - \mu_G)^2}{2\sigma_G^2}} dz_k$$

$$= \frac{1}{\Delta_k}\left(Q\left(\frac{y - \mu_G - \Delta_k}{\sigma_G}\right) - Q\left(\frac{y - \mu_G}{\sigma_G}\right)\right),$$

Where the standard Q-function is defined as $$Q(\zeta) = \frac{1}{\sqrt{2\pi}} \int_{\zeta}^{\infty} \exp\left(\frac{-\zeta^2}{2}\right) d\zeta.$$

Figure 9:
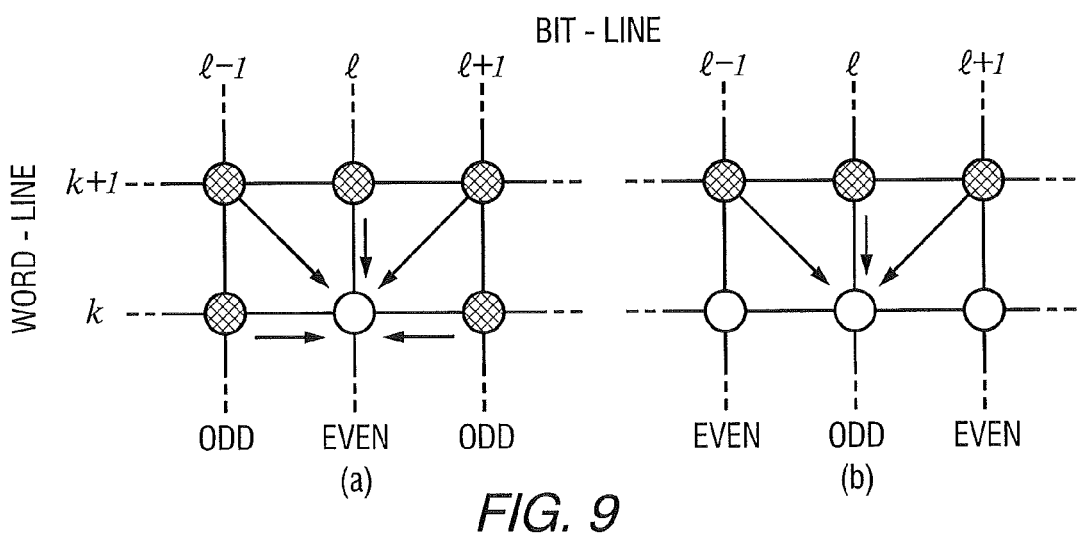
FIG. 9 illustrates an embodiment of an even/odd bit line structure.

In two-dimensional (2D) page oriented memories with cell-to-cell interference, a single cell is only affected by a finite anticausal neighborhood of nearby cells (which are programmed after the single cell). In the case of multilevel flash memories with the even/odd bit-line structure and using the full-sequence programming strategy, cells in even bit lines, referred to as even cells, are programmed first at one time instant, and then cells in odd bit lines, referred to as odd cells, are programmed at a later time instant. Hence, the neighborhoods are also dependent on whether the even cell or the odd cell is programmed in the programming cycle. Let (k,l) denote the location of a memory cell, which means that the cell is located at the k-th word line and the l-th bit line. The indices of the anticausal neighborhood for the odd cell may be indicated by O(k,l) and the indices of the anticausal neighborhood for the even cell may be indicated by E(k,l), as illustrated in FIG. 9. That is:

$$O_{(k,l)} \triangleq \{(k+1,l-1),(k+1,l),(k+1,l+1)\} \quad (20)$$

and $$E_{(k,l)} \triangleq \{(k,l-1),(k,l+1)\} \cup O_{(k,l)}. \quad (21)$$

The channel model for odd locations (the case when l is odd) is:

$$Y_{(k,l)} = X_{(k,l)} + \sum_{(m,n) \in O_{(k,l)}} (Y_{(m,n)} + E_{(m,n)}) B_{(m,n)}^{(k,l)} + W_{(k,l)} \quad (22)$$

and for even locations (the case when l is even):

$$Y_{(k,l)} = X_{(k,l)} + \sum_{(m,n) \in E_{(k,l)}} (Y_{(m,n)} + E_{(m,n)}) B_{(m,n)}^{(k,l)} + W_{(k,l)}. \quad (23)$$

If $X_{(k,l)}$ is a 2D i.i.d. process, in various embodiments the detector may be implemented as discussed hereinabove (i.e., a trellis is not needed). However, if $X_{(k,l)}$ is a process with 2D memory, an optimal detector is not known (since a 2D equivalence of a Viterbi detector is not available), and in various embodiments may be appropriately approximated using adequate (and, in various embodiments, interleaved) 1D Viterbi-like or symbol-by-symbol detectors.

Figure 10:
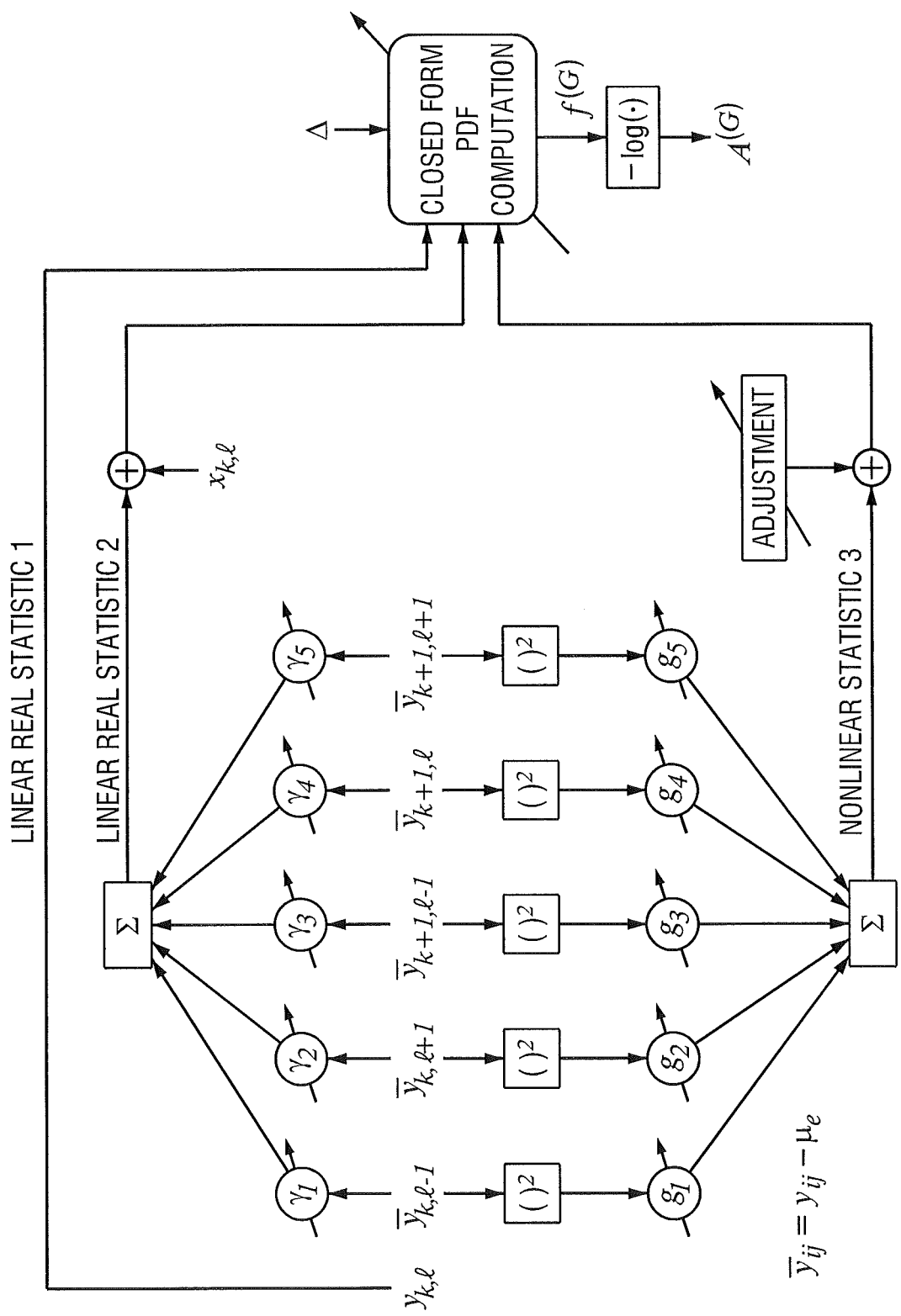
FIGS. 10-12 illustrate embodiments of computation modules.

FIG. 10 illustrates an embodiment in a 2-dimensional array. The neighborhood of signal samples represents the cells that victimize an even cell. It may be understood that similar representations may be made for even neighborhoods, or for an all-bit line write structure). The shown embodiment computes 3 statistics. Statistics 1 and 2 are linear statistics (and further statistic 1 is a trivial statistic). Statistic 3 is a nonlinear statistic. The arrows through some components indicate that the components may be signal-dependent. This means that the exact method of computing the statistics and/or branch metrics may depend on the postulated written signal (or a neighborhood of written signals). If the channel has signal-dependent or signal-independent ISI (in addition to ICI), then the decision metric may be a trellis branch metric. If the channel has no ISI (but only ICI), then the decision metric may be a symbol-by-symbol decision metric. This embodiment computes the two non-trivial statistics using 2 FIR filters. The first filter (coefficients γ) operates on the (possibly mean adjusted) signal samples while the second FIR filter (coefficients g) operates on the (possibly mean-adjusted) squares of the signal samples. The pdf computation block is any pdf computation block. In one embodiment, the pdf block may correspond only to the Gaussian noise assumption. A second embodiment may use the quantization noise assumption (resulting in Q-function implementations). The value Δ denotes the quantization noise step, which itself may be signal-dependent. A third embodiment may consider, for example, a hybrid assumption. The logarithmic block may be useful in hard decision detection. In soft-decision detection, the logarithmic block may be omitted, or replaced by another block (such as, for example, a likelihood-ratio computing block or a probability computing block, depending on the type of soft information utilized). It may be understood that different types of soft or hard decisions will result in removal or replacement of the logarithmic block by another and possibly more suitable block.

Figure 11:
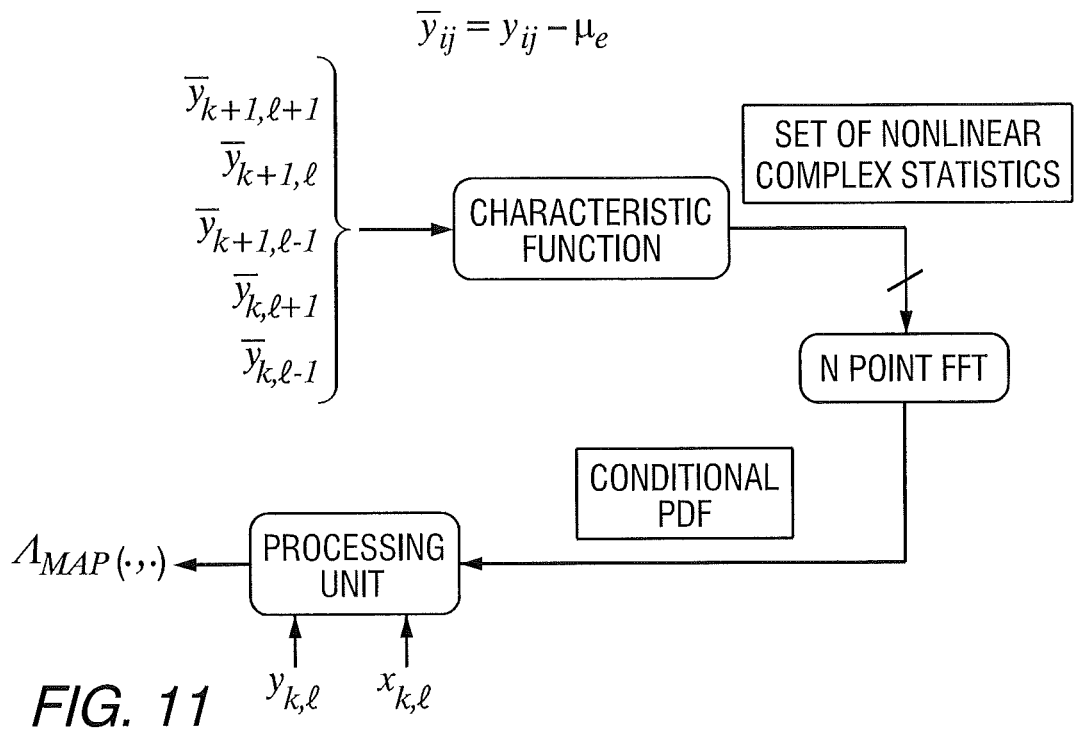

FIG. 11 illustrates an embodiment in a 2-dimensional array. The neighborhood of signal samples represents the cells that victimize an even cell. It may be understood that similar representations may be made for even neighborhoods, or for an all-bit line write structure. The shown embodiment computes N nonlinear statistics. Each statistic is a sample of the characteristic function (which itself is a non-real, complex quantity). Though no arrows through components are shown, it may be understood that the components may be signal-dependent. This means that the exact method of computing the statistics and/or branch metrics may depend on the postulated written signal (or a neighborhood of written signals). If the channel has signal-dependent or signal-independent ISI (in addition to ICI), then the decision metric may be a trellis branch metric. If the channel has no ISI (but only ICI), then the decision metric may be a symbol-by-symbol decision metric. The processing unit block may be fine-tuned to account for any conditional pdf (i.e., any noise pdf and or ICI coefficient pdf). In one embodiment, the processing unit may correspond only to the Gaussian noise assumption. A second embodiment may use the quantization noise assumption (resulting in Q-function implementations). A third embodiment may consider a hybrid assumption. The processing unit may include a logarithmic sub-block depending on whether hard decisions or soft decisions are desired. A logarithmic sub-block may be useful in hard decision detection. In soft-decision detection, the logarithmic sub-block may be omitted, or replaced by another sub-block (such as, for example, a likelihood-ratio computing sub-block or a probability computing sub-block, depending on the type of soft information utilized). It may be understood that different types of soft or hard decisions will result in removal or inclusion of the logarithmic (or another) sub-block into the processing unit.

Figure 12:
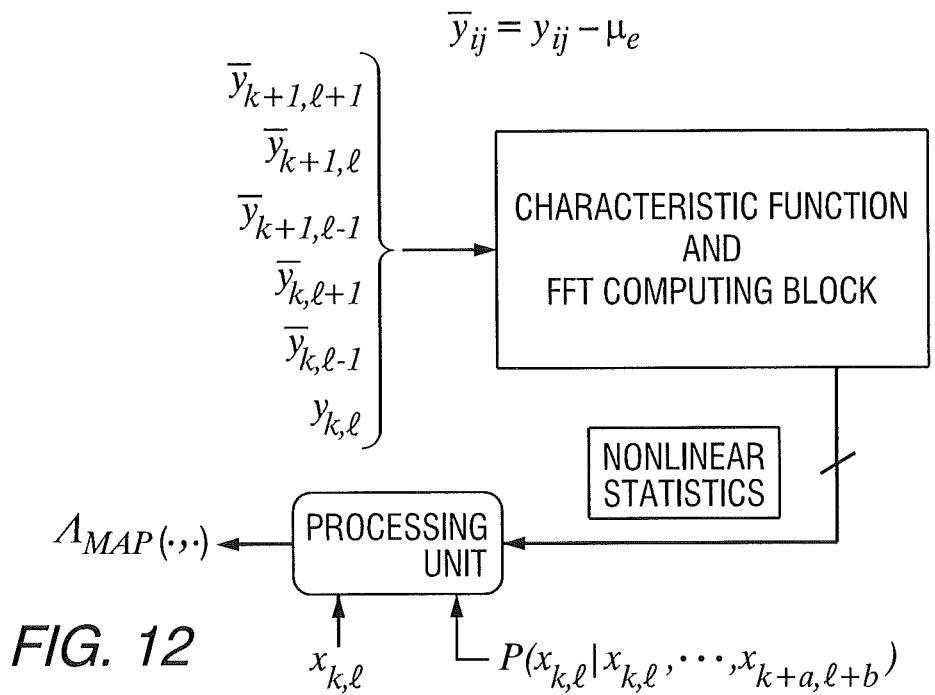

FIG. 12 illustrates an embodiment in a 2-dimensional array. The neighborhood of signal samples represents the cells that victimize an even cell, as well as the victim cell itself. It may be understood that similar representations may be made for even neighborhoods, or for an all-bit line write structure. The shown embodiment computes a set of nonlinear statistics by combining the characteristic function and the FFT into one computational unit. Though no arrows through components are shown, it may be understood that the components may be signal-dependent. This means that the exact method of computing the statistics and/or branch metrics may depend on the postulated written signal (or a neighborhood of written signals). If the channel has signal-dependent or signal-independent ISI (in addition to ICI), then the decision metric may be a trellis branch metric. If the channel has no ISI (but only ICI), then the decision metric may be a symbol-by-symbol decision metric. The processing unit block may be fine-tuned to account for any conditional pdf (i.e., any noise pdf and or ICI coefficient pdf). In one embodiment, the processing unit may correspond only to the Gaussian noise assumption. A second embodiment may use the quantization noise assumption (resulting in Q-function implementations). A third embodiment may consider, for example, a hybrid assumption. The processing unit may include a logarithmic sub-block depending on whether hard decisions or soft decisions are desired. A logarithmic sub-block may be useful in hard decision detection. In soft-decision detection, the logarithmic sub-block may be omitted, or replaced by another sub-block (such as, for example, a likelihood-ratio computing sub-block or a probability computing sub-block, depending on the type of soft information utilized). It may be understood that different types of soft or hard decisions will result in removal or inclusion of the logarithmic (or another) sub-block into the processing unit. FIG. 12 shows one of the inputs into the processing unit as being $P(x_{k,1}|x_{k,1}, \ldots, x_{k+a,1+b})$. In various embodiments, this may be the actual a-priori probability of input symbols, or it may be the a-posteriori probability provided by a soft decoder (in either an iterative or a non-iterative architecture).

Derivation and Description of Decision Statistics

Reverting back to the 1-dimensional signals, under the assumption that $Y_{k-1}^{k-1} = y_{k-1}^{k-1}$ and $X_{k-M}^{k} = x_{k-M}^{k}$ are given, $Z_l$ is the product of two Gaussian random variables which may be rewritten as:

$$Z_l = B_l \Gamma_l \qquad (24)$$

Where $\Gamma_l \sim \mathcal{N}(y_{k-l}, \sigma_E^2)$. It may be assumed $B_l = B_l^{(k)}$ to simplify the notation. Then, the characteristic function for the product of two normal random variables $B_l \Gamma_l$ may be computed as:

$$G_{Z_l|y_{k-l}^k, x_{k-M}^k}(t) = \mathbb{E}[e^{iB_l \Gamma_l t}] \qquad (25)$$

$$= \mathbb{E}[\mathbb{E}[e^{iB_l \Gamma_l t} | \Gamma_l]]$$

$$= \mathbb{E}\left[e^{i\beta_l \Gamma_l t - \frac{1}{2} g_l \Gamma_l^2 t^2}\right]$$

$$= \frac{1}{\sqrt{2\pi\sigma_E^2}} \int_{-\infty}^{\infty} e^{(i\beta_l \gamma t - \frac{1}{2} g_l \gamma^2 t^2)} e^{-\frac{(\gamma - y_{k-l})^2}{2\sigma_E^2}} d\gamma$$

$$= \frac{1}{\sqrt{2\pi\sigma_E^2}} \int_{-\infty}^{\infty} \exp\left\{ -\frac{\left[\gamma - \frac{y_{k-l} + it\beta_l \sigma_E^2}{1 + t^2 g_l \sigma_E^2}\right]^2}{\frac{2\sigma_E^2}{1 + t^2 g_l \sigma_E^2}} - \frac{t^2(y_{k-l}^2 g_l + \beta_l^2 \sigma_E^2) - 2it y_{k-l} \beta_l}{2(1 + g_l \sigma_E^2 t^2)} \right\} d\gamma$$

$$= \frac{1}{\sqrt{1 + g_l \sigma_E^2 t^2}} \exp\left( \frac{-t^2(y_{k-l}^2 g_l + \beta_l^2 \sigma_E^2) + 2it y_{k-l} \beta_l}{2(1 + g_l \sigma_E^2 t^2)} \right)$$

Figure 13:
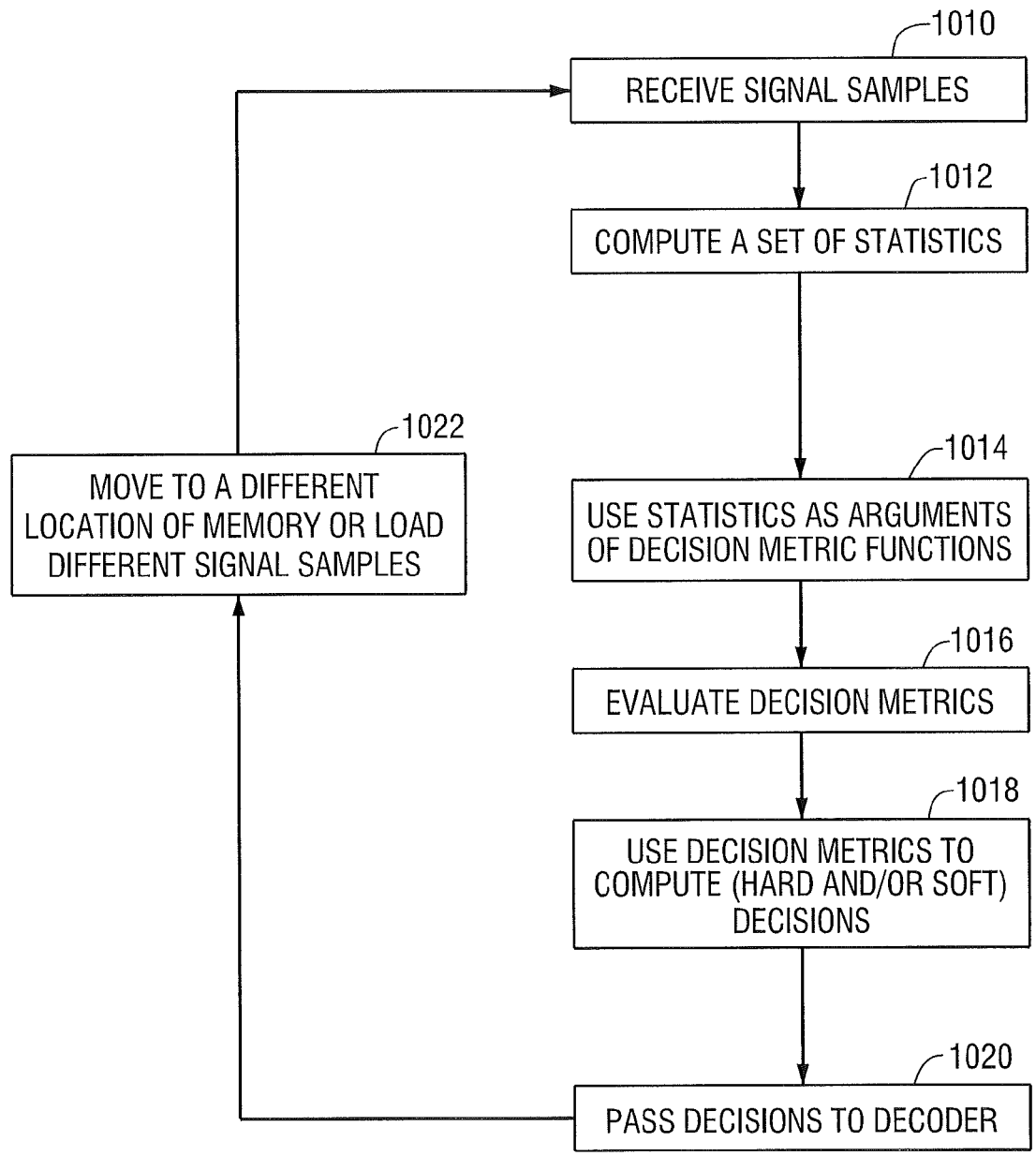
FIG. 13 illustrates an embodiment of a process for determining decision metric values.

FIG. 13 illustrates an embodiment of a process for determining decision metric values. At step 1010, signal samples are received. In various embodiments, the signal samples may be, for example, unconditioned signal samples, mean adjusted signal samples, pre-equalized signal samples, digitized signal samples and/or quantized signal samples. At step 1012, at least one set of statistics is computed using the signal samples. In various embodiments, at least one of the statistics in the set is not a real linear statistic. At step 1014, the statistics are used as arguments of decision metric functions and at step 1016 the decision metrics are evaluated. At step 1018 the decision metrics are used (e.g., by a symbol-by-symbol based detector, a trellis-based detector, etc.) to compute hard and/or soft decisions. At step 1020, the decisions are passed to, for example, a decoder. At step 1022, the process continues for a different location of memory or different signal samples that are loaded by, for example, updating the content of a shift register to load the different signal samples.

The following illustrates examples of statistics derived from a plurality of signal samples in order to delineate those statistics that are applicable and those that are not applicable to various embodiments. It may be understood that these are only examples and by no means represent an exhaustive list.

I) Examples of real linear statistics extracted from a plurality of signal samples:

a) $y_k - a(y_{k-1} - \mu_e) - b(y_{k-2} - \mu_e)$ where a and b are real coefficients; and $y_k$, $(y_{k-1} - \mu_e)$ and $(y_{k-2} - \mu_e)$ are either signal samples or mean-adjusted signal samples (the mean being $\mu_e$). This is an example of a statistic derived from signals in 1 dimension.

b) $y_{k,l} - a(y_{k-1,l-1} - \mu_e) - b(y_{k-2,l+1})$ where a and b are real coefficients. This is an example of a statistic derived from signals in 2 dimensions.

II) Examples of nonlinear statistics that are actually functions of linear statistics extracted from a plurality of signal samples:

a) $[y_k - a(y_{k-1} - \mu_e) - b(y_{k-2} - \mu_e)]^2$ where a and b are real coefficients; and $y_k$, $(y_{k-1} - \mu_e)$ and $(y_{k-2} - \mu_e)$ are either signal samples or mean-adjusted signal samples (the mean being $\mu_e$). This is an example of a statistic derived from signals in 1 dimension. This is a simple square of the linear statistic given in I)-a), so it is a function of a single linear statistic derived from a plurality of signal samples.

b) $\log [y_{k,l} - a(y_{k-1,l-1} - \mu_e) - b(y_{k-2,l+1})]$ where a and b are real coefficients. This is an example of a statistic derived from signals in 2 dimensions. It is a simple logarithm of the linear statistic given in I)-b), so it is a function of a single linear statistic.

c) $[y_k - a(y_{k-1} - \mu_e) - b(y_{k-2} - \mu_e)]^2 + [y_k - A(y_{k-1} - \mu_e) - B(y_{k-2} - \mu_e)]^2$ where a, b, A and B are real coefficients; and $y_k$, $(y_{k-1} - \mu_e)$ and $(y_{k-2} - \mu_e)$ are either signal samples or mean-adjusted signal samples (the mean being $\mu_e$). This is an example of a statistic obtained as a function of 2 linear statistics each one of which is already a linear statistic derived from a plurality of signal samples. So, it is a function of previously derived linear statistics involving a plurality of signal samples.

III) Examples of complex linear statistics derived from plurality of signal samples:

a) $y_k - a(y_{k-1} - \mu_e) - b(y_{k-2} - \mu_e)$ where a and b are complex (non-real) coefficients; and $y_k$, $(y_{k-1} - \mu_e)$ and $(y_{k-2} - \mu_e)$ are either signal samples or mean-adjusted signal samples (the mean being $\mu_e$). A discrete Fourier transform is an example of a complex linear sufficient statistic.

b) $y_{k,l} - a(y_{k-1,l-1} - \mu_e) - b(y_{k-2,l+1})$ where a and b are complex (non-real) coefficients. This is an example of a statistic derived from a signal in 2 dimensions.

IV) Examples of a genuine nonlinear statistic derived from a plurality of signal samples that is not a simple function of a linear statistic (derived from a plurality of signal samples):

a) $y_k - a(y_{k-1} - \mu_e)^2 - b(y_{k-2} - \mu_e)^2$ where a and b are complex or coefficients; and $y_k$, $(y_{k-1} - \mu_e)$ and $(y_{k-2} - \mu_e)$ are either signal samples or mean-adjusted signal samples (the mean being $\mu_e$). Because of the few "squared signal" terms, the statistic is nonlinear. Note that this statistic cannot be written as a function of a liner statistic (derived from a plurality of signal samples), so it is genuinely nonlinear.

b) $\dfrac{y_{k,l}}{b(y_{k-2,l+1})} + \dfrac{y_{k,l}}{a(y_{k-1,l-1} - \mu_e)}$ where a and b are complex or real coefficients. This is a genuine non-linear statistic (derived from a plurality of signal samples) because it cannot be obtained as a function of a single linear statistic (obtained from a plurality of signal samples) or multiple linear statistics (obtained from a plurality of signal samples).

The characteristic function c) $G_{Y_k|Y_{k-1},Y_{k-2},X_k}(t|y_{k-1},y_{k-2},x_k)$ sampled at an arbitrary value t because the general form cannot be written as a function of a single linear statistic (obtained from a plurality of signal samples) or multiple linear statistics (obtained from a plurality of signal samples).

A detector constructed according to various embodiments operates on complex linear statistics derived from signal samples and genuine nonlinear statistics that are not simple functions of linear statistics, examples of which are illustrated hereinabove at III and IV.

Performance Curves

Figure 14:
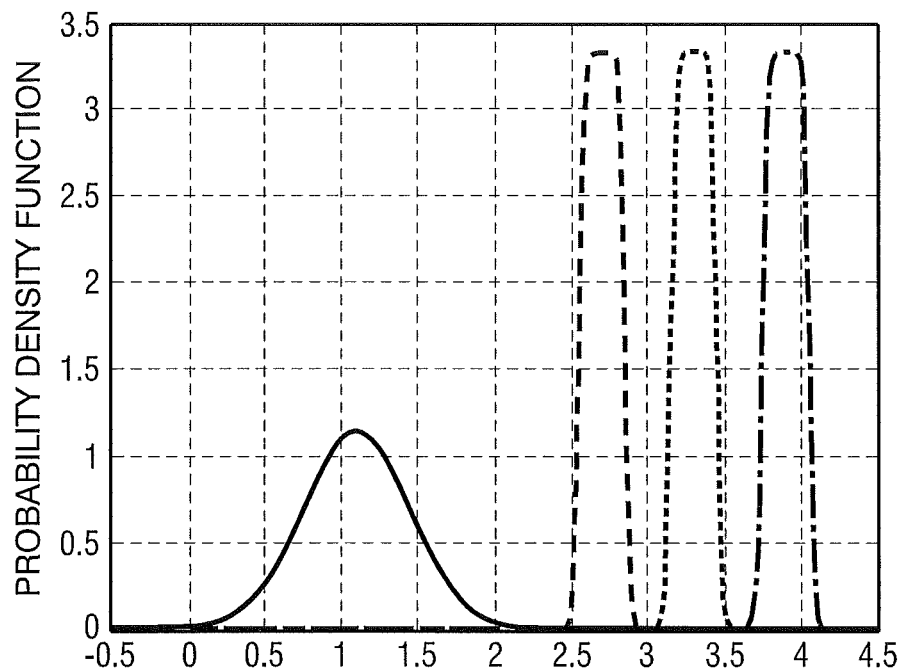
FIG. 14 illustrates a graph of a probability density function vs. a threshold voltage.

Simulations were performed of various embodiments of the methods and systems herein using an even/odd bit-line structure. A 4-level flash memory channel was selected, where the channel input $X_k$ is an i.i.d. process with parameters $Pr(X_k = v_j) = 0.25$ for any of the 4 levels $v_0$, $v_1$, $v_2$, or $v_3$. The parameters of the 4-level flash memory (2D channel) with signal-dependent noise are given in Table 1. With the parameters as in Table 1, and using $\sigma=1$, FIG. 14 illustrates the pdf of each level's voltage when no ICI occurs.

TABLE I

PARAMETERS OF THE 4-LEVEL FLASH MEMORY

| i | 0 | 1 | 2 | 3 |
|---|---|---|---|---|
| ith level $v_i$ | 1.1 | 2.7 | 3.3 | 3.9 |
| $\Delta$ (i) | 0 | 0.3 | 0.3 | 0.3 |
| $\sigma_w$ (i) | 0.35$\sigma$ | 0.03$\sigma$ | 0.03$\sigma$ | 0.03$\sigma$ |

It was assumed that the random coupling ratios $\Gamma_{(a,b)}^{(k,l)}$ have the following Gaussian distributions:

$\Gamma_{(k,l-1)}^{(k,l)} \sim \mathcal{N}(\gamma_h, g_h)$, $\Gamma_{(k,l+1)}^{(k,l)} \sim \mathcal{N}(\gamma_h, g_h)$, $\Gamma_{(k+1,l-1)}^{(k,l)} \sim \mathcal{N}(\gamma_d, g_d)$, $\Gamma_{(k+1,l+1)}^{(k,l)} \sim \mathcal{N}(\gamma_d, g_d)$ $\Gamma_{(k+1,l)}^{(k,l)} \sim \mathcal{N}(\gamma_v, g_v)$, (26)

where the subscripts h, v and d mean horizontal, vertical and diagonal interference, respectively. It was also assumed that: $\gamma_h : \gamma_v : \gamma_d = 0.1 : 0.08 : 0.006$ and $g_i = 0.09 \gamma_i^2$ for $i \in \{h, v, d\}$. Let s be the intercell coupling strength factor. Then $\gamma_h = 0.1 \, s$, $\gamma_v = 0.08 \, s$ and $\gamma_d = 0.006 \, s$.

In a first simulation scenario, $\sigma=1$ and the coupling strength factor s varied from 0 to 2.

In a second simulation scenario, s=0.75, and the parameter $\sigma$ was varied (see Table 1). By varying $\sigma$, the signal-to-noise ratio (SNR) was varied, defined as:

$$SNR \triangleq \dfrac{1}{\sum_i Pr(X_k = v_i) \sigma_w^2(i)}. \quad (27)$$

SIQ is the capacity of random linear block codes, which is proven to be the highest information rate achievable by a random low-density parity-check (LDPC) error correction code. Furthermore, the SIQ allows a comparison of performances of codes without going through the complicated task of simulating the actual codes. For example, if SIQ of detector A is 0.5 dB better than the SIQ of detector B, then a random LDPC code using outputs from detector A will outperform the same random LDPC code using outputs from detector B by 0.5 dB. In other words, if detector A is used, a 0.5 dB weaker code may be used while achieving the same overall system performance.

Figure 15:
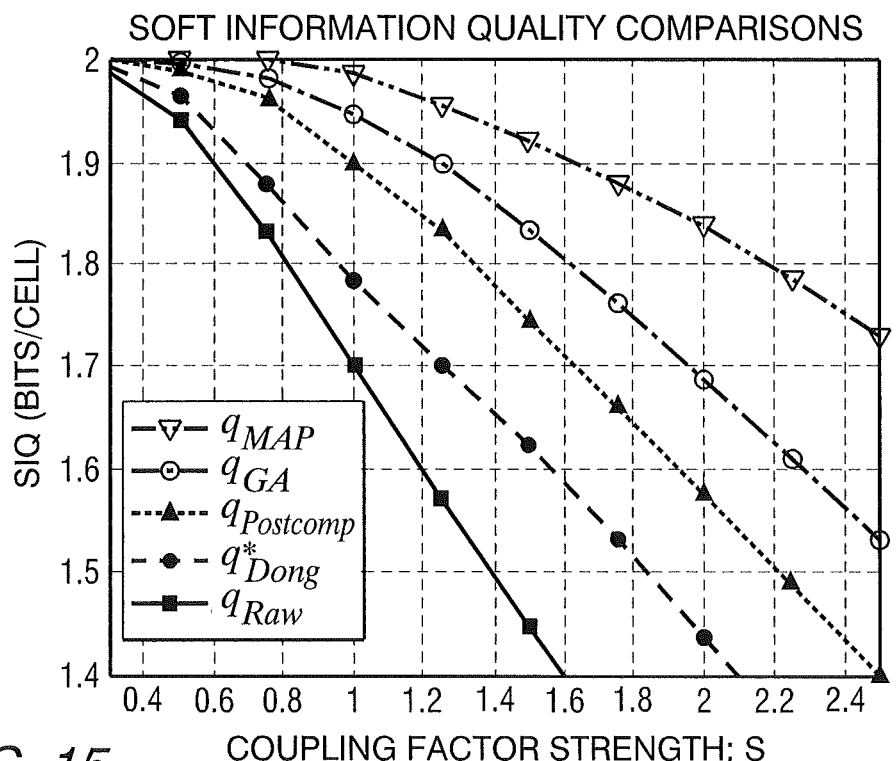
FIGS. 15 and 16 illustrate graphs of SIQ comparisons for different detectors.
Figure 16:
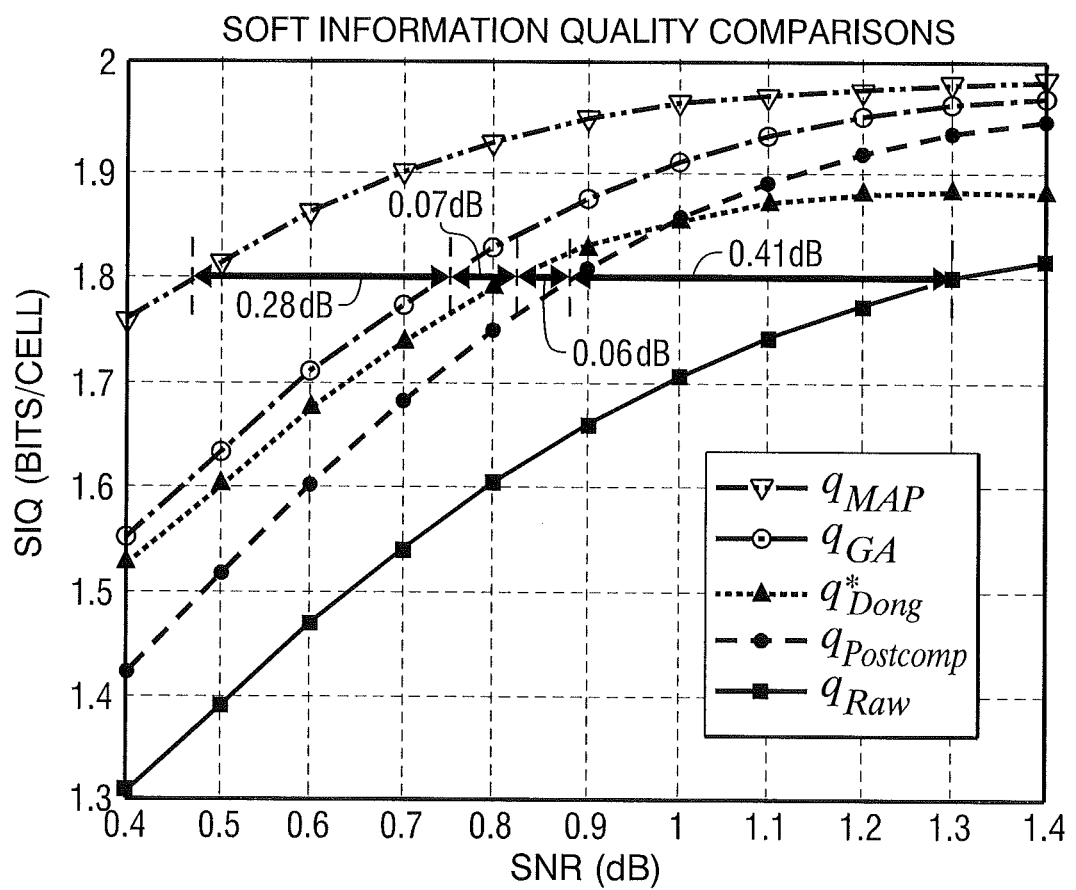

The mutual information terms in may be computed numerically using Monte-Carlo simulations for any detector (also for a hard-decision detector). For the special case of a MAP detector, the soft-information quality $q_{MAP}$ has an alternative interpretation, i.e., $q_{MAP}$ is equal to the BCJR-once bound. FIG. 15 shows the soft information qualities of the MAP detector and the GA detector when the coupling strength factor s varies for fixed SNR. FIG. 16 shows the soft information quality curves when the SNR varies for fixed s=0.75. Also shown in FIGS. 15 and 16 are soft information qualities of the post-compensation detector and the raw detector. FIGS. 15 and 16 also show an upper bound on the soft information quality of a soft-output detector, denoted by $q_{Dong}*$. At SIQ=1.8 bits per cell (which corresponds to a code rate of 0.9 user bits per channel bit), the MAP detector outperforms known detectors by 0.35 dB, as shown in FIG. 16.

As observable in FIG. 15, the Gaussian approximation (GA-MAP) detector (the FIR filter embodiment that utilizes statistics derived by squaring the signal samples) betters the purely linear statistics embodiment (denoted by "postcomp" in FIG. 15) by roughly a 20% in terms of ICI tolerance capability. Further, the figure reveals that the GA-MAP detector has roughly a 100% larger ICI tolerance when compared to the "raw" detector (i.e., a simple slicer that does not consider a plurality of signal samples in the decision metric). FIG. 15 also shows that the characteristic functions statistics (CF) embodiment (MAP) has a roughly 60% better ICI tolerance than the "postcomp" (linear) detector, and a roughly 170% better ICI tolerance than the "raw" (slicer) detector.

As shown in FIG. 16, the performance of MAP detectors is better than other detectors. The variable N in the MAP detector is the number of quantization points in computing the FFT (i.e., N is the support length of the FFT) (In the simulations, N=512 was used).

In another aspect, the invention may be implemented as a non-transitory computer readable medium containing software for causing a computer or computer system to perform the method described above. The software may include various modules that are used to enable a processor and a user interface to perform the methods described herein.

It will be readily appreciated by those skilled in the art that modifications may be made to the invention without departing from the concepts disclosed in the forgoing description. Accordingly, the particular embodiments described in detail herein are illustrative only and are not limiting to the scope of the invention.

What is claimed is:

1. A method for determining decision metrics in a detector for a memory device, the method comprising:
   receiving a plurality of signal samples;
   extracting a set of statistics from the signal samples, wherein at least one of the statistics is non-linear or complex, is derived from a plurality of the signal samples, and is not a function of at least one real linear statistic that is derived from a plurality of the signal samples; and
   applying at least one decision metric function to the set of statistics to determine at least one decision metric value corresponding to at least one postulated symbol.

2. The method of claim 1, wherein extracting a set of statistics includes at least one of filtering quadratic signals, filtering cubed signals, computing a characteristic function, and computing a fast Fourier transform (FFT).

3. The method of claim 1, wherein applying at least one decision metric function includes applying at least one of a symbol by symbol metric function and a branch metric function.

4. The method of claim 2, wherein applying at least one decision metric function includes applying at least one of a symbol by symbol metric function and a branch metric function.

5. A system, comprising:
   a memory channel; and
   a detector in communication with the memory channel, the detector configured to:
      receive a plurality of signal samples;
      extract a set of statistics from the signal samples, wherein at least one of the statistics is non-linear or complex, is derived from a plurality of the signal samples, and is not a function of at least one real linear statistic that is derived from a plurality of the signal samples; and
      apply at least one decision metric function to the set of statistics to determine at least one decision metric value corresponding to at least one postulated symbol.

6. The system of claim 5, further comprising:
   an encoder in communication with the memory channel; and
   a decoder in communication with the detector.

7. The system of claim 5, wherein the detector is one of a hard decision detector and a soft decision detector.

8. The system of claim 5, wherein the detector is one of a symbol-by-symbol detector and a Viterbi-like detector.

9. The system of claim 5, wherein the detector is configured to extract a set of statistics from the signal samples by at least one of filtering quadratic signals, filtering cubed signals, computing a characteristic function, and computing a fast Fourier transform (FFT).

10. A detector for a memory device, the detector comprising:
    a first circuit configured to receive a plurality of signal samples;
    a second circuit in communication with the first circuit, the second circuit configured to extract a set of statistics from the signal samples, wherein at least one of the statistics is non-linear or complex, is derived from a plurality of the signal samples, and is not a function of at least one real linear statistic that is derived from a plurality of the signal samples; and
    a third circuit in communication with the second circuit, the third circuit configured to apply at least one decision metric function to the set of statistics to determine at least one decision metric value corresponding to at least one postulated symbol.

11. The detector of claim 10, wherein the second circuit is further configured to at least filter quadratic signals, filter cubed signals, compute a characteristic function, and compute a fast Fourier transform (FFT).

12. An apparatus, comprising:
    means for receiving a plurality of signal samples;
    means for extracting a set of statistics from the signal samples, wherein at least one of the statistics is non-linear or complex, is derived from a plurality of the signal samples, and is not a function of at least one real linear statistic that is derived from a plurality of the signal samples; and
    means for applying at least one decision metric function to the set of statistics to determine at least one decision metric value corresponding to at least one postulated symbol.

13. A non-transitory computer readable medium including software for:
    receiving a plurality of signal samples;
    extracting a set of statistics from the signal samples, wherein at least one of the statistics is non-linear or complex, is derived from a plurality of the signal samples, and is not a function of at least one real linear statistic that is derived from a plurality of the signal samples; and
    applying at least one decision metric function to the set of statistics to determine at least one decision metric value corresponding to at least one postulated symbol.

14. A method for determining decision metrics in a detector for a memory device, the method comprising:
    receiving a plurality of signal samples;
    computing a set of statistics, wherein at least one of the statistics is obtained by FIR filtering or IIR filtering of at least one squared signal sample; and
    applying at least one decision metric function to the set of statistics to determine at least one decision metric value corresponding to at least one postulated symbol.

15. The method of claim 14, wherein applying at least one decision metric function includes applying at least one of a symbol by symbol metric function and a branch metric function.

16. A method for determining decision metrics in a detector for a memory device, the method comprising:
    receiving a plurality of signal samples;
    computing a set of statistics using a transformation of signal samples to obtain a characteristic-function-like set of statistics; and
    applying at least one decision metric function to the set of statistics to determine at least one decision metric value corresponding to at least one postulated symbol.

17. The method of claim 16, wherein the decision metric function includes a fast Fourier transform (FFT) calculation.

18. The method of claim 16, wherein applying at least one decision metric function includes applying at least one of a symbol by symbol metric function and a branch metric function.

19. A method for determining decision metrics in a detector for a memory device, the method comprising:
    receiving a signal sample and at least one adjacent signal sample;

computing a set of at least one statistic, wherein the at least one statistic is obtained by nonlinearly processing the at least one adjacent signal sample; and applying at least one decision metric function to the at least one statistic to determine at least one decision metric value corresponding to at least one postulated symbol.

20. The method of claim 19, wherein the at least one statistic is obtained by squaring the at least one adjacent signal sample.

21. The method of claim 19, wherein the at least one statistic is obtained by computing the characteristic function of the at least one adjacent signal sample.

22. The method of claim 19, wherein applying at least one decision metric function comprises applying at least one of a symbol-by-symbol function and a branch metric function.

23. The method of claim 20, wherein applying at least one decision metric function comprises applying at least one of a symbol-by-symbol function and a branch metric function.

24. The method of claim 21, wherein applying at least one decision metric function comprises applying at least one of a symbol-by-symbol function and a branch metric function.

* * * * *